(12) United States Patent
Weng (10) Patent No.: US 11,516,940 B2
(45) Date of Patent: Nov. 29, 2022

(54) MIDDLE BEZEL FRAME WITH HEAT DISSIPATION STRUCTURE

(71) Applicant: ASIA VITAL COMPONENTS CO., LTD., New Taipei (TW)

(72) Inventor: Ming-Tai Weng, New Taipei (TW)

(73) Assignee: Asia Vital Components Co., Ltd., New Taipei (TW)

( * ) Notice: Subject to any disclaimer, the term of this patent is extended or adjusted under 35 U.S.C. 154(b) by 0 days.

(21) Appl. No.: 16/232,025

(22) Filed: Dec. 25, 2018

(65) Prior Publication Data
US 2020/0205316 A1    Jun. 25, 2020

(51) Int. Cl.
*H05K 7/20*   (2006.01)

(52) U.S. Cl.
CPC ......... *H05K 7/20336* (2013.01); *H05K 7/202* (2013.01); *H05K 7/2039* (2013.01); *H05K 7/20218* (2013.01)

(58) Field of Classification Search
CPC ............... H05K 7/20336; H05K 7/202; H05K 7/20218; H05K 7/2039; F28D 15/02; F28D 15/04; F28D 15/046
USPC .................................................... 165/104.26
See application file for complete search history.

(56) References Cited

U.S. PATENT DOCUMENTS

| | | | | |
|---|---|---|---|---|
| 4,046,190 A * | 9/1977 | Marcus | ............... | F28D 15/0233 165/104.26 |
| 5,355,942 A * | 10/1994 | Conte | ................. | F28D 15/0233 165/104.33 |
| 6,525,420 B2 * | 2/2003 | Zuo | ........................ | H01L 23/427 257/713 |
| 7,342,788 B2 * | 3/2008 | Nikfar | ................. | F28D 15/0275 361/700 |
| 7,411,790 B2 * | 8/2008 | Huang | ................... | H01L 23/427 165/104.33 |
| 7,480,992 B2 * | 1/2009 | Okamoto | ............ | H01J 37/3497 228/2.1 |
| 8,792,238 B2 * | 7/2014 | Meyer, IV | .......... | F28D 15/0275 165/104.21 |
| 9,445,526 B2 * | 9/2016 | Zhou | ................... | H05K 7/20272 |
| 10,458,718 B2 * | 10/2019 | Shen | ................... | F28D 15/0275 |

(Continued)

FOREIGN PATENT DOCUMENTS

| CN | 104053335 A | 9/2014 |
|---|---|---|
| CN | 204014401 U | 12/2014 |

(Continued)

OTHER PUBLICATIONS

Search Report dated Apr. 30, 2019 issued by Taiwan Intellectual Property Office for counterpart application No. 107144515.

(Continued)

*Primary Examiner* — Tho V Duong
(74) *Attorney, Agent, or Firm* — Bradley J. Thorson; DeWitt LLP (57) ABSTRACT

A middle bezel frame with heat dissipation structure includes a main body, which includes a frame portion and at least one heat-exchange portion. The frame portion is located around and connected to the heat-exchange portion. The heat-exchange portion internally has an airtight chamber, in which at least one wick structure and a working fluid are provided. With these arrangement, the middle bezel frame has enhanced structural strength while provides good heat dissipation effect.

4 Claims, 7 Drawing Sheets

(56) References Cited

U.S. PATENT DOCUMENTS

| | | | |
|---|---|---|---|
| 10,605,538 B2* | 3/2020 | Ahamed | F28D 15/0233 |
| 10,622,282 B2* | 4/2020 | Prajapati | H05K 7/20336 |
| 10,700,571 B2* | 6/2020 | Zhou | H02K 9/227 |
| 2008/0266885 A1* | 10/2008 | Sun | F21V 29/763 |
| | | | 362/373 |
| 2016/0128233 A1 | 5/2016 | Lai | |
| 2016/0288276 A1* | 10/2016 | Chen | F28D 15/04 |
| 2018/0274866 A1* | 9/2018 | Zhao | H01L 23/427 |

FOREIGN PATENT DOCUMENTS

| | | |
|---|---|---|
| CN | 104902727 A | 9/2015 |
| CN | 105992504 A | 10/2016 |
| CN | 106455404 A | 2/2017 |
| CN | 108036664 A | 5/2018 |
| CN | 208016229 U | 10/2018 |
| CN | 209643232 U | 11/2019 |
| TW | 470846 | 1/2002 |
| TW | 502101 | 9/2002 |
| TW | M426065 U | 4/2012 |
| TW | I582367 B | 5/2017 |

OTHER PUBLICATIONS

Search Report dated Dec. 21, 2019 issued by China National Intellectual Property Administration for counterpart application No. 2018115360027.

Search Report dated Apr. 22, 2020 issued by China National Intellectual Property Administration for counterpart application No. 2018115360027.

* cited by examiner

MIDDLE BEZEL FRAME WITH HEAT DISSIPATION STRUCTURE

FIELD OF THE INVENTION

The present invention relates to a middle bezel frame with heat dissipation structure, and more particularly, to a middle bezel frame with heat dissipation structure that has enhanced structural strength and provides good heat dissipation effect.

BACKGROUND OF THE INVENTION

The currently available mobile devices are more and more powerful in performance; the computing chips inside these mobile devices also have high-efficient operating speed to therefore produce a large amount of heat during work. The produced heat must be removed from the mobile devices, lest the computing chips should be burnt out. Since the mobile devices are more and more compact and thin in design, the space available in the mobile devices for various electronic elements is largely narrowed. Therefore, heat dissipation elements for removing heat from the compact mobile devices must also be designed to fit the narrow internal space of the mobile devices.

There are mobile device manufacturers who use a specially designed vapor chamber as the middle bezel frame or the back cover of the mobile device for carrying different electronic elements thereon. There are also other manufacturers who directly use a copper material with good heat conducting efficiency to manufacture the middle bezel frame or the back cover that has a heat-exchange chamber. However, the copper material is relatively soft and has low structural strength, which tends to result in deformation and poor supporting ability of the middle bezel frame or the back cover. To overcome this drawback, aluminum or other alloy thereof with better structural strength has been used in place of copper material to manufacture the middle bezel frame or the back cover, and vapor chambers or heat pipes are further connected to the aluminum middle bezel frame or the back cover through diffusion bonding or other suitable ways. However, diffusion bonding tends to produce high amount of heat, which tends to vaporize the working fluid or damage the wick structures in the vapor chambers or the heat pipes to increase the yield loss of the middle bezel frame or the back cover.

Some manufacturers also try to bond heat pipes or vapor chambers to the middle bezel frame using double-sided adhesive tapes or liquid adhesives. However, the use of the double-sided adhesive tapes or the liquid adhesives tends to increase the thermal resistance between the middle bezel frame and the vapor chambers or the heat pipes to cause decreased heat conducting efficiency. Further, the middle bezel frame with the vapor chambers or the flat heat pipes bonded thereto will have an increased overall thickness and is accordingly, not suitable for use with the current mobile devices that have very limited narrow internal space.

It is therefore an important goal of the middle bezel frame manufacturers to develop an improved middle bezel frame or a back cover that not only allows a heat dissipation unit to be provided in the limited narrow space thereof to enable good heat conducting efficiency, but also has an enhanced structural strength for carrying electronic elements thereon.

SUMMARY OF THE INVENTION

To effectively solve the problems in the conventional middle bezel frame, it is a primary object of the present invention to provide a middle bezel frame with heat dissipation structure, which has good supporting strength and provides high heat conducting performance.

To achieve the above and other objects, the middle bezel frame with heat dissipation structure according to an embodiment of the present invention includes a main body, which includes a frame portion and at least one heat-exchange portion. The frame portion is located around and connected to the heat-exchange portion. The heat-exchange portion internally has an airtight chamber, in which at least one wick structure and a working fluid are provided.

To achieve the above and other objects, the middle bezel frame with heat dissipation structure according to another embodiment of the present invention includes a main body, which includes a frame portion, a receiving portion, and at least one heat-exchange element. The receiving portion and the frame portion are connected to each other to form an integral body; and the heat-exchange element is fitted in the receiving portion with outer edges connected to the frame portion through laser welding.

In the present invention, a material having good structural strength is selected for making the frame portion of the middle bezel frame, and a material having good heat conducting performance is selected for forming the heat-exchange portion/element. The heat-exchange portion/element is then connected to the frame portion through laser welding to overcome the problems of weak structural strength and poor heat conducting performance in the conventional middle bezel frame.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

The present invention will now be described with some preferred embodiments thereof and by referring to the accompanying drawings. For the purpose of easy to understand, elements that are the same in the preferred embodiments are denoted by the same reference numerals.

Figure 1:
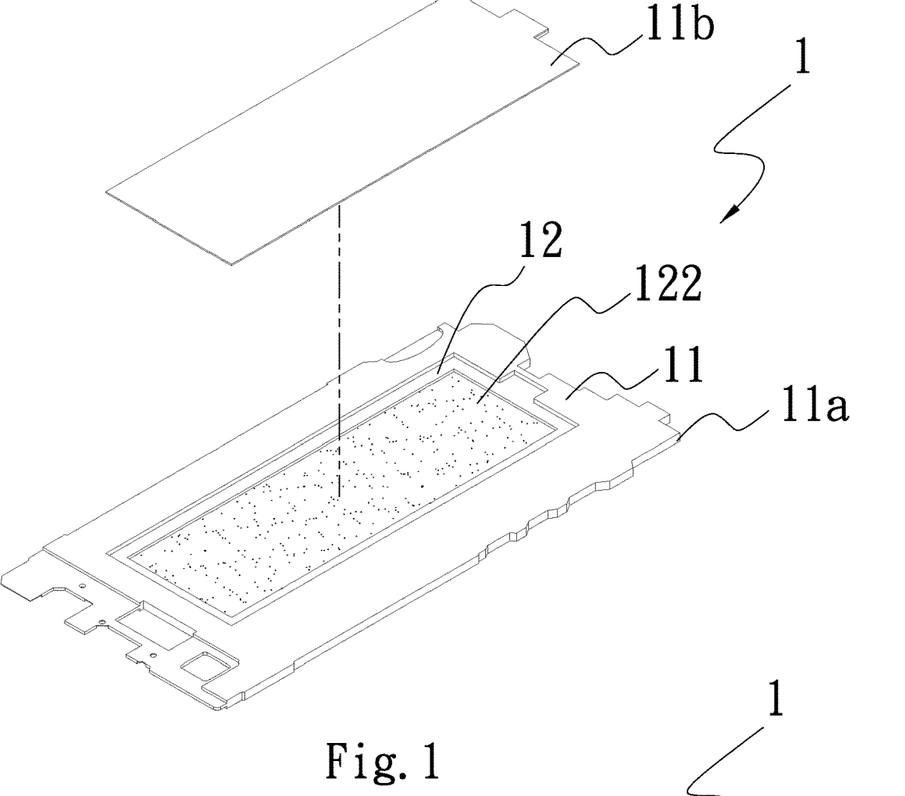
FIG. 1 is an exploded perspective view of a middle bezel frame with heat dissipation structure according to a first embodiment of the present invention.
Figure 2:
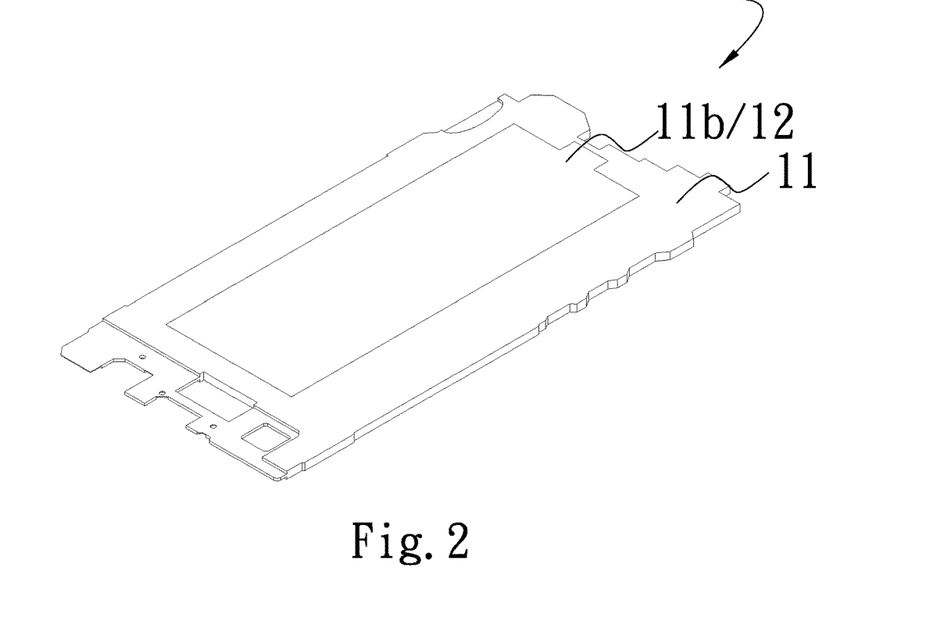
FIG. 2 is an assembled view of FIG. 1.
Figure 3:
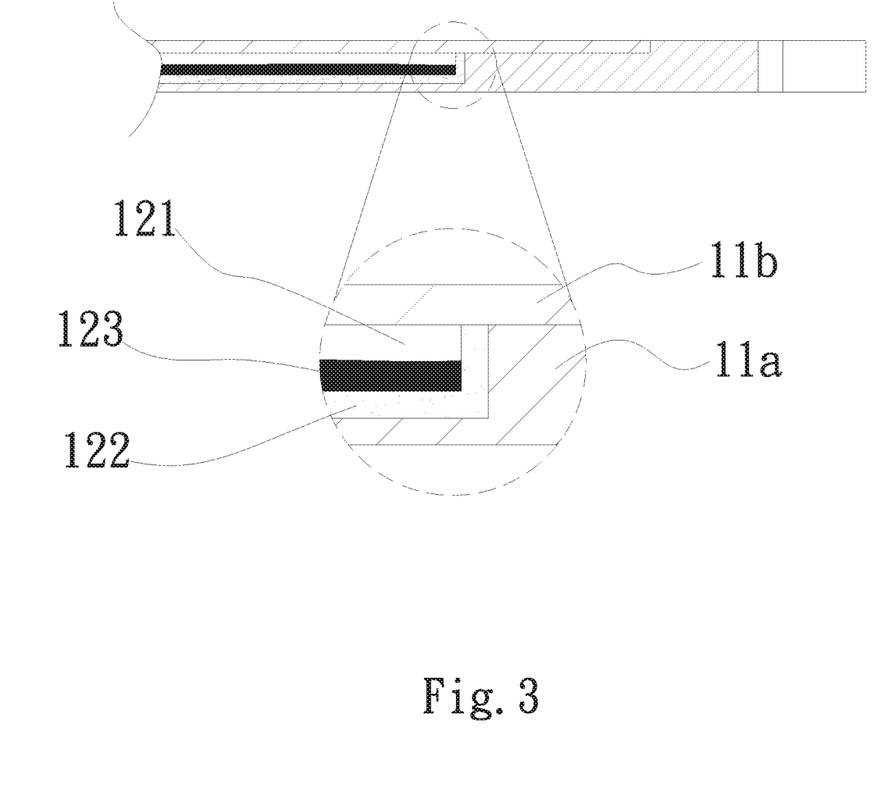
FIG. 3 is a fragmentary, assembled sectional view of the middle bezel frame with heat dissipation structure shown in FIGS. 1 and 2 and includes an enlarged view of a circled area thereof.

Please refer to FIGS. 1 and 2, which are exploded and assembled perspective views, respectively, of a middle bezel frame with heat dissipation structure according to a first embodiment of the present invention; and to FIG. 3, which is a fragmentary, assembled sectional view of the middle bezel frame with heat dissipation structure shown in FIGS. 1 and 2 and includes an enlarged view of a circled area thereof. As shown, the middle bezel frame with heat dissipation structure according to the first embodiment of the present invention includes a main body 1.

The main body 1 includes a frame portion 11 and at least one heat-exchange portion 12. The frame portion 11 is located around and connected to the heat-exchange portion 12. In the heat-exchange portion 12, there is an airtight chamber 121, in which at least one wick structure 122 and a working fluid 123 is provided. The working fluid 123 can be a gas (a coolant) or a liquid. In the case of a liquid, the working fluid 123 can be acetone, pure water, ethylene glycol, or alcohol. The heat-exchange portion 12 and the frame portion 11 can be made of the same or different materials, and the material can be gold, silver, copper, aluminum, titanium, a titanium alloy, or any combination thereof.

The frame portion 11 of the main body 1 consists of a first plate member 11a and a second plate member 11b, which can be made of gold, silver, copper, stainless steel, aluminum, commercially pure titanium, a titanium alloy, or any combination thereof.

The first and the second plate member 11a, 11b can be made of the same or different materials.

The first and the second plate member 11a, 11b are overlapped to together define the airtight chamber 121 between them. The first plate member 11a is preferably made of a material with good supporting strength, such as stainless steel or a titanium alloy, and the second plate member 11b is preferably made of a material with good thermal conduction, such as gold, silver, copper, or commercially pure titanium, such that a liquid-vapor circulation is possible in the airtight chamber 121 defined between the first and the second plate member 11a, 11b to provide the heat-exchange portion 12.

Figure 4:
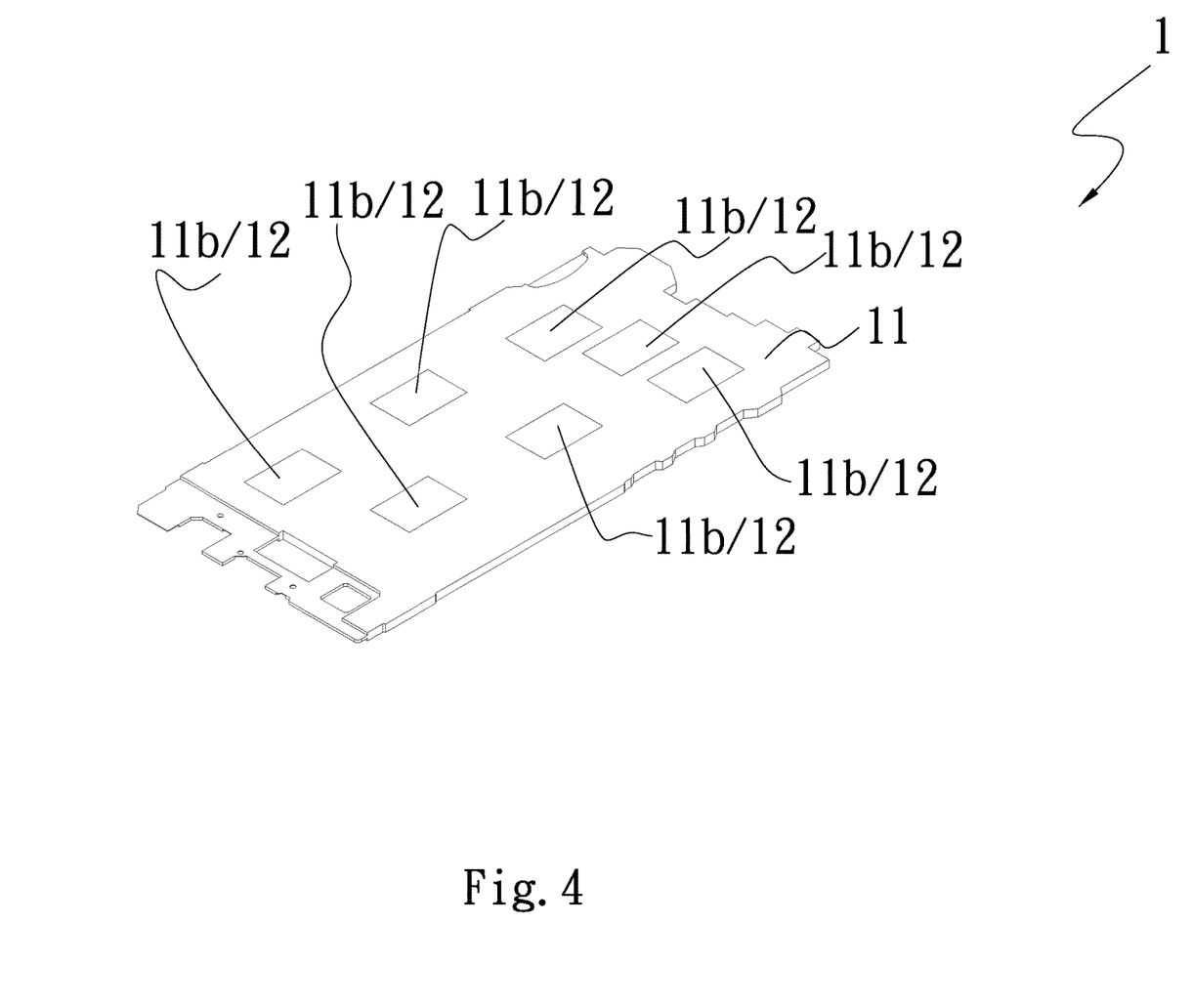
FIG. 4 is a perspective view of a variant of the middle bezel frame with heat dissipation structure according to the first embodiment of the present invention.

Please refer to FIG. 4, which is a perspective view of a variant of the middle bezel frame with heat dissipation structure according to the first embodiment of the present invention. As shown, a plurality of heat-exchange portions 12 can be formed corresponding to different heat sources to be arranged on the middle bezel frame. In other words, a plurality of second plate members 11b can be provided for correspondingly overlapping desired locations on the first plate member 11a from an upper or a lower side thereof. The first plate member 11a and the second plate members 11b are then connected to one another through laser welding, mechanical press-fitting or other suitable ways.

Figure 5:
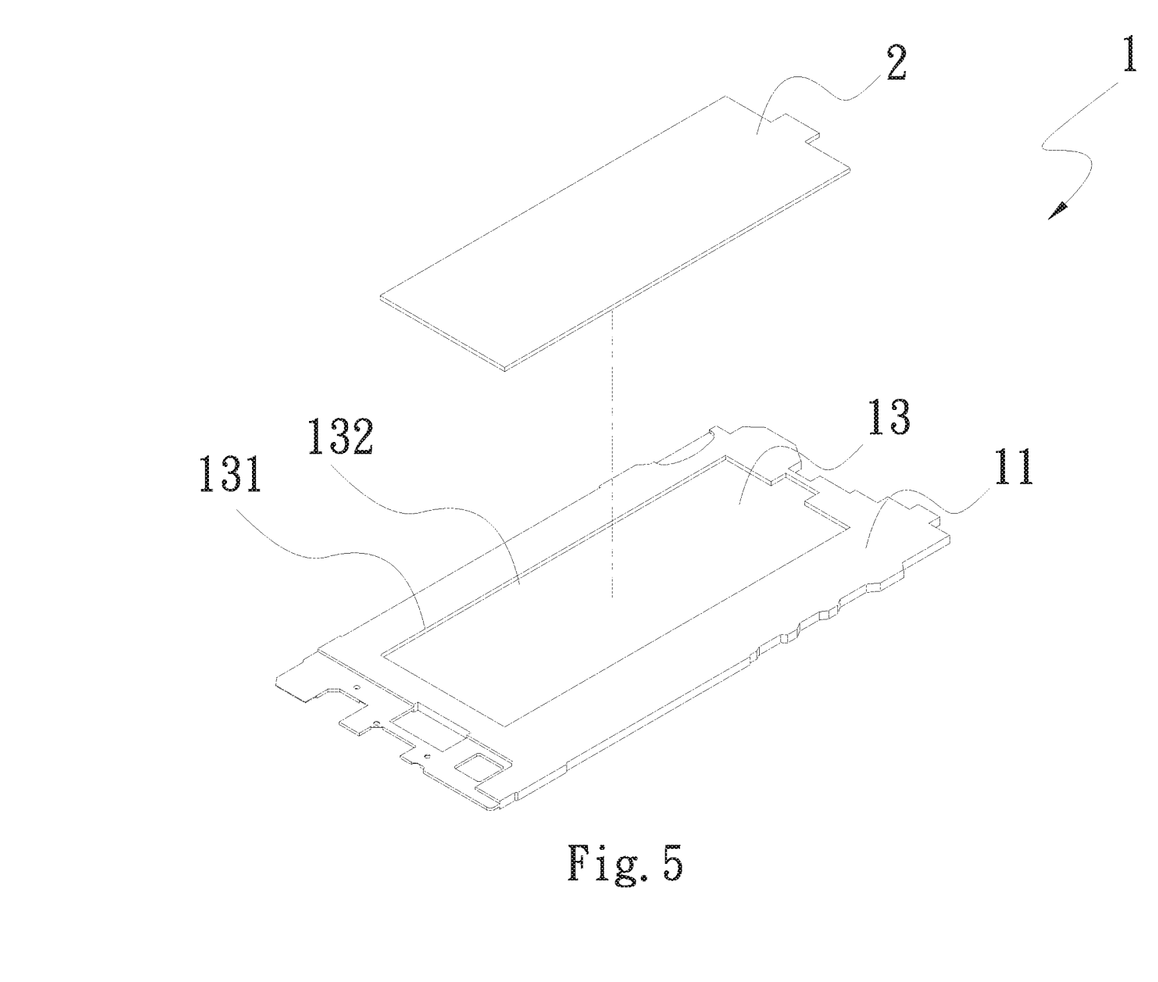
FIG. 5 is an exploded perspective view of a middle bezel frame with heat dissipation structure according to a second embodiment of the present invention.

FIG. 5 is an exploded perspective view of a middle bezel frame with heat dissipation structure according to a second embodiment of the present invention. In the second embodiment, there is a main body 1 consisting of a frame portion 11, a receiving portion 13, and a heat-exchange element 2. The frame portion 11 and the heat-exchange element 2 are two independent units connected to each other.

In the second embodiment, the main body 1 is partially recessed to form the receiving portion 13, which and the frame portion 11 are connected to each other to form an integral body. The receiving portion 13 has an open side 131 and an opposite closed side 132. The heat-exchange element 2 is fitted in the receiving portion 13 with one side being flatly attached to the closed side 132 of the receiving portion 13 and another opposite side being protruded from, flush with, or lower than the open side 131 of the receiving portion 13. The heat-exchange element 2 fitted in the receiving portion 13 has outer edges connected to the frame portion 11 through laser welding.

Figure 6:
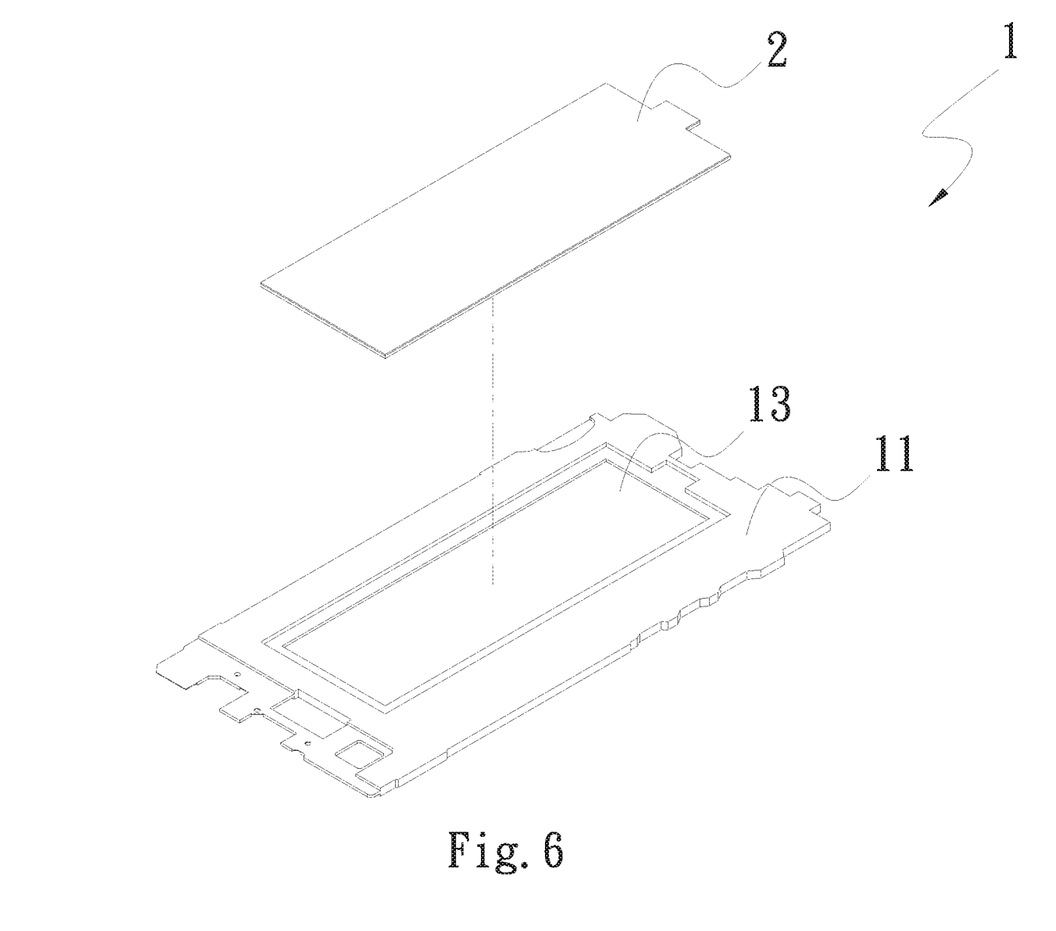
FIG. 6 is an exploded perspective view of a middle bezel frame with heat dissipation structure according to a third embodiment of the present invention.
Figure 7:
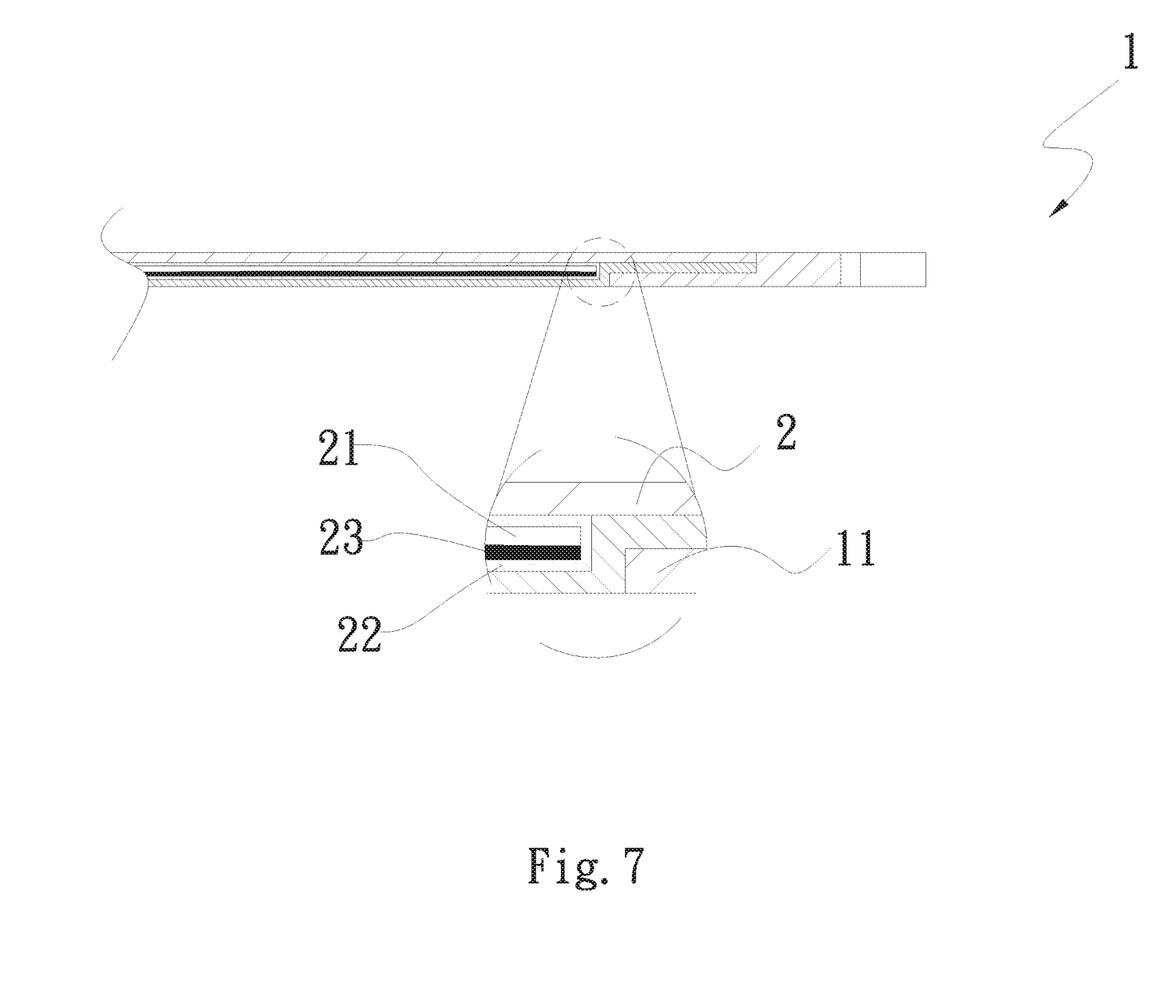
FIG. 7 shows a fragmentary, assembled sectional view of the middle bezel frame with heat dissipation structure shown in FIG. 6 and an enlarged view of a circled area thereof.

Please refer to FIGS. 6 and 7, which are exploded perspective view and fragmentary, assembled sectional view, respectively, of a middle bezel frame with heat dissipation structure according to a third embodiment of the present invention. The third embodiment is generally structurally similar to the second one, except that the receiving portion 13 formed on the main body 1 is a through opening extended through and communicating with an upper and a lower side of the main body 1. The heat-exchange element 2 is fitted or mounted in the through opening 13 with its upper and lower side being optionally flush with, protruded from or lower than the upper and lower side of the main body 1, respectively.

The heat-exchange element 2 in each of the second and the third embodiment of the present invention internally defines an airtight chamber 21, in which a wick structure 22 and a working fluid 23 are provided. The heat-exchange element 2 can be a vapor chamber or a flat heat pipe. In the third embodiment, the heat-exchange element 2 is non-restrictively illustrated as a vapor chamber. Further, the vapor chamber or the flat heat pipe is connected at its ineffective areas, i.e. its outer peripheral areas outside the airtight chamber 21, to the frame portion 11 through laser, laser welding, or mechanical pressing.

In each of the above-described second and third embodiments, the heat-exchange element 2 can be otherwise replaced by any other conductor with good thermal conductivity, such as a copper block, a graphite block, a graphene sheet, or commercially pure titanium.

Figure 8:
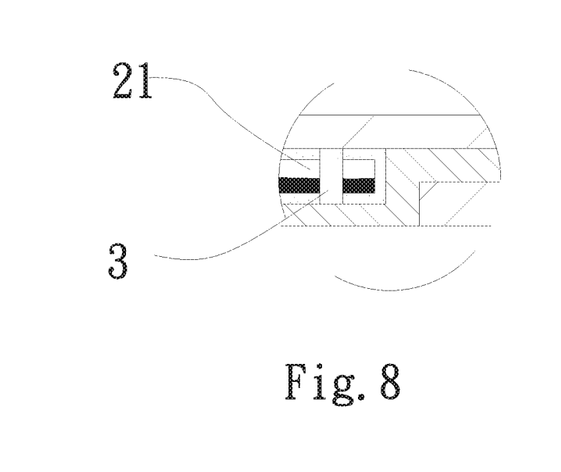
FIG. 8 shows a fragmentary, assembled sectional view of a middle bezel frame with heat dissipation structure according to a fourth embodiment of the present invention.
Figure 9:
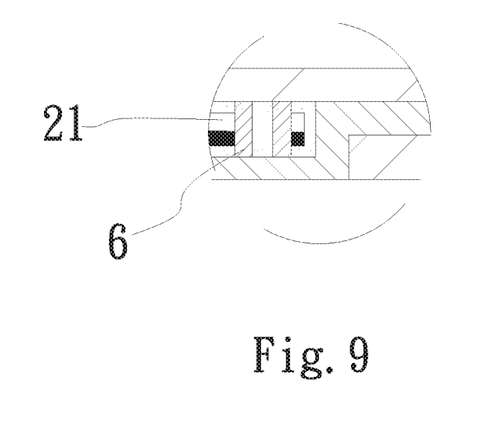
FIG. 9 shows a fragmentary, assembled sectional view of a middle bezel frame with heat dissipation structure according to a fifth embodiment of the present invention.
Figure 10:
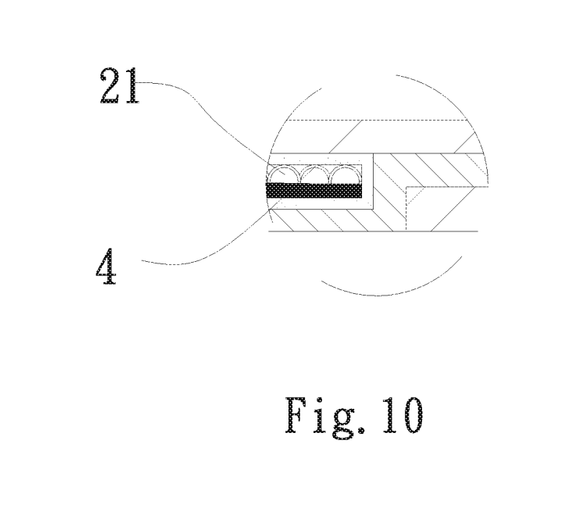
FIG. 10 shows a fragmentary, assembled sectional view of a middle bezel frame with heat dissipation structure according to a sixth embodiment of the present invention.
Figure 11:
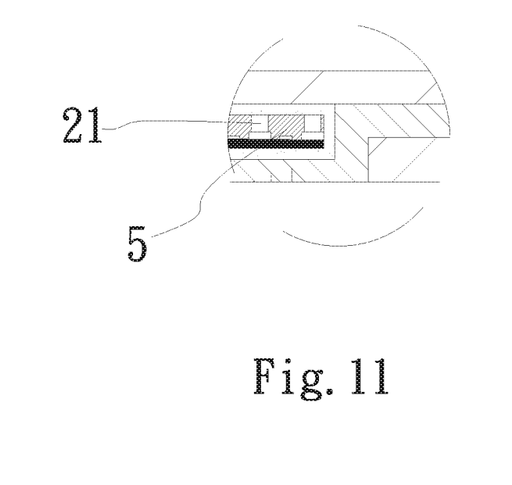
FIG. 11 shows a fragmentary, assembled sectional view of a middle bezel frame with heat dissipation structure according to a seventh embodiment of the present invention.

The airtight chamber 121 in the first embodiment and the airtight chambers 21 in each of the second and third embodiments can be internally provided with a supporting structure. According to a fourth embodiment of the present invention, the supporting structure includes at least one solid post 3 as shown in FIG. 8. According to a fifth embodiment of the present invention, the supporting structure includes at least one hollow cylindrical post 6 as shown in FIG. 9. According to a sixth embodiment of the present invention, the supporting structure includes at least one corrugated plate 4 as shown in FIG. 10. According to a seventh embodiment of the present invention, the supporting structure includes at least one intermediate supporting member 5 with horizontal and vertical vents as shown in FIG. 11. These differently configured supporting structures can be disposed in the airtight chamber 121, 21 to extend from one inner wall surface to press against another opposite inner wall surface of the airtight chamber 121, 21 or to press against the wick structure 122, 22 provided on the opposite inner wall surface of the airtight chamber 121, 21, so as to provide the airtight chamber 121, 21 with an enhanced supporting strength.

Unlike the conventional middle bezel frame that is made of only a material with good thermal conductivity and therefore disadvantageously has relatively poor structural strength, the middle bezel frame according to the present invention has a main body, a frame portion thereof is made of a material having better structural strength, such as stainless steel, titanium, aluminum, or an aluminum alloy, and a heat-exchange portion of the main body is formed by coupling a material having good thermal conductivity with the frame portion to form an integral middle bezel frame that has an airtight chamber to provide a temperature evenness effect. Alternatively, the middle bezel frame according to the present invention has a main body having a frame portion and a receiving portion, and a separate heat-exchange element fitted in the receiving portion and connected to the frame portion to form an integral body. In either case, the middle bezel frame according to the present invention can have increased structural strength and improved heat dissipation efficiency to overcome the disadvantages of the conventional middle bezel frame. Further, in view that materials having good thermal conductivity are usually more expensive to increase the manufacturing cost of the middle bezel frame, the present invention can also use different materials at different areas of the middle bezel frame to largely reduce the material cost thereof.

Conventionally, the middle bezel frame is connected to the vapor chamber or the flat heat pipe or is manufactured to include a heat-absorbing area defining an airtight chamber all through general welding or diffusion bonding, which will disadvantageously produce high temperature to vaporize the working fluid or damage the wick structure in the vapor chamber, flat heat pipe or the airtight chamber. However, according to the present invention, the first plate member 11*a* and the second 11*b* of the frame portion 11 or the frame portion 11 and the heat-exchange element 2 are connected to one another through laser welding or mechanical pressing to eliminate the disadvantages caused by general welding and diffusion bonding.

The present invention has been described with some preferred embodiments thereof and it is understood that many changes and modifications in the described embodiments can be carried out without departing from the scope and the spirit of the invention that is intended to be limited only by the appended claims.

What is claimed is:

1. A middle bezel frame with a heat dissipation structure for interfacing with at least one electronic element in a mobile device, comprising:
    a main body for carrying the at least one electronic element and including a plurality of heat-exchange portions and a frame portion, the plurality of heat-exchange portions formed adjacent and underneath the frame portion and in contact with the at least one electronic element in the mobile device; and each of the plurality of heat-exchange portions being an airtight chamber, in which at least one wick structure and a working fluid are provided; and
    the frame portion of the main body having a first plate member with a supporting strength characteristic and a plurality of second plate members with a thermal conduction characteristic, the at least one wick structure being disposed on the first plate member, each of the plurality of second plate members overlapping and covering a separate one of the plurality of heat-exchange portions.

2. The middle bezel frame with heat dissipation structure as claimed in claim 1, wherein the first and the second plate member are formed of the same or different materials.

3. The middle bezel frame with heat dissipation structure as claimed in claim 1, wherein the heat-exchange portion and the frame portion are made of the same or different materials; and the materials usable to make the heat-exchange portion and the frame portion being selected from the group consisting of gold, silver, copper, aluminum, titanium, a titanium alloy, and any combination thereof.

4. The middle bezel frame with heat dissipation structure as claimed in claim 1, wherein the working fluid is selected from the group consisting of a gas or a liquid; and the liquid being selected from the group consisting of a coolant, acetone, pure water, ethylene glycol, and alcohol.

\* \* \* \* \*